US006865706B1

(12) United States Patent
Rohrbaugh et al.

(10) Patent No.: US 6,865,706 B1
(45) Date of Patent: Mar. 8, 2005

(54) APPARATUS AND METHOD FOR GENERATING A SET OF TEST VECTORS USING NONRANDOM FILLING

(75) Inventors: John G Rohrbaugh, Ft Collins, CO (US); Jeff Rearick, Ft Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 422 days.

(21) Appl. No.: 09/589,338

(22) Filed: Jun. 7, 2000

(51) Int. Cl.[7] .......................... G01R 31/28; G06F 11/00
(52) U.S. Cl. ...................................... 714/738; 714/728
(58) Field of Search .............................. 714/738, 728

(56) References Cited

U.S. PATENT DOCUMENTS

| | | | | |
|---|---|---|---|---|
| 5,305,328 A | * | 4/1994 | Motohara et al. | 714/741 |
| 5,377,197 A | * | 12/1994 | Patel et al. | 714/724 |
| 5,410,552 A | * | 4/1995 | Hosokawa | 714/738 |
| 5,485,471 A | * | 1/1996 | Bershteyn | 714/739 |
| 5,726,996 A | * | 3/1998 | Chakradhar et al. | 714/724 |
| 6,061,818 A | * | 5/2000 | Touba et al. | 714/739 |
| 6,067,651 A | * | 5/2000 | Rohrbaugh et al. | 714/738 |
| 6,237,117 B1 | * | 5/2001 | Krishnamoorthy | 714/724 |
| 6,253,343 B1 | * | 6/2001 | Hosokawa et al. | 714/726 |
| 6,327,687 B1 | * | 12/2001 | Rajski et al. | 714/738 |
| 6,449,743 B1 | * | 9/2002 | Hosokawa | 714/738 |
| 6,662,327 B1 | * | 12/2003 | Rajski | 714/738 |

OTHER PUBLICATIONS

TDB–ACC–NO: NN770647; "PLA Macro Optimized Test Pattern Generation"; IBM Technical Disclosure Bulletin, Jun. 1977, Vo 20, Isuue 1, p. No. 47–53.*
S. T. Chakradhar et al, "A Transitive Closure Algorithm for Test Generation," IEEE Trans. on Computer–Aided Design, vol. 12, pp. 1015–1028, Jul. 1993.*
NN72012510, "Identifying Sources of Unknown Levels Generated during Three Value Fault Simulation". Jan. 1972, IBM Technical Disclosure Bulletin, Vo.: 14, Issue No.: 8, p. No.: 2510–2512, Jan. 1, 1972.*

* cited by examiner

*Primary Examiner*—Joseph D. Torres

(57) ABSTRACT

The present invention is generally directed to an improved automatic test pattern generator for generating test patterns that are used by an integrated circuit testing device. In accordance with one aspect of the invention, a method is provided for generating a set of test vectors for testing an integrated circuit, each test vector of the set of test vectors containing a plurality of bits defining test inputs for the integrated circuit. The method includes the steps of defining a list of faults for the integrated circuit, and generating at least one test vector that defines values for those inputs necessary to detect at least one target fault selected from the list of faults, the values comprising only a portion of the bits of the at least one test vector, wherein a remainder of the bits in the at least one test vector are unspecified bit positions. The method further includes the step of setting the values of a plurality of the unspecified bit positions using a nonrandom filling methodology.

22 Claims, 11 Drawing Sheets

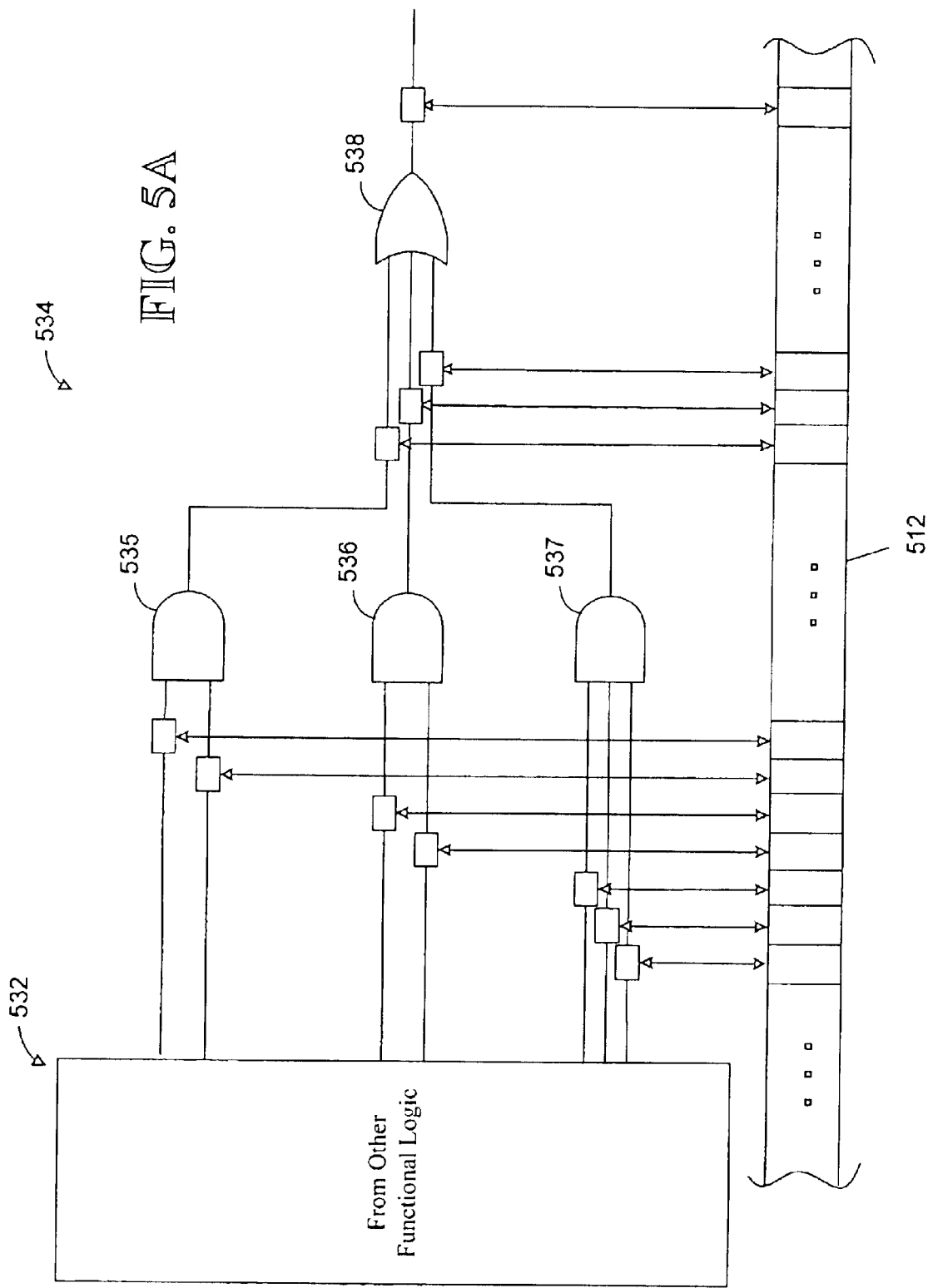

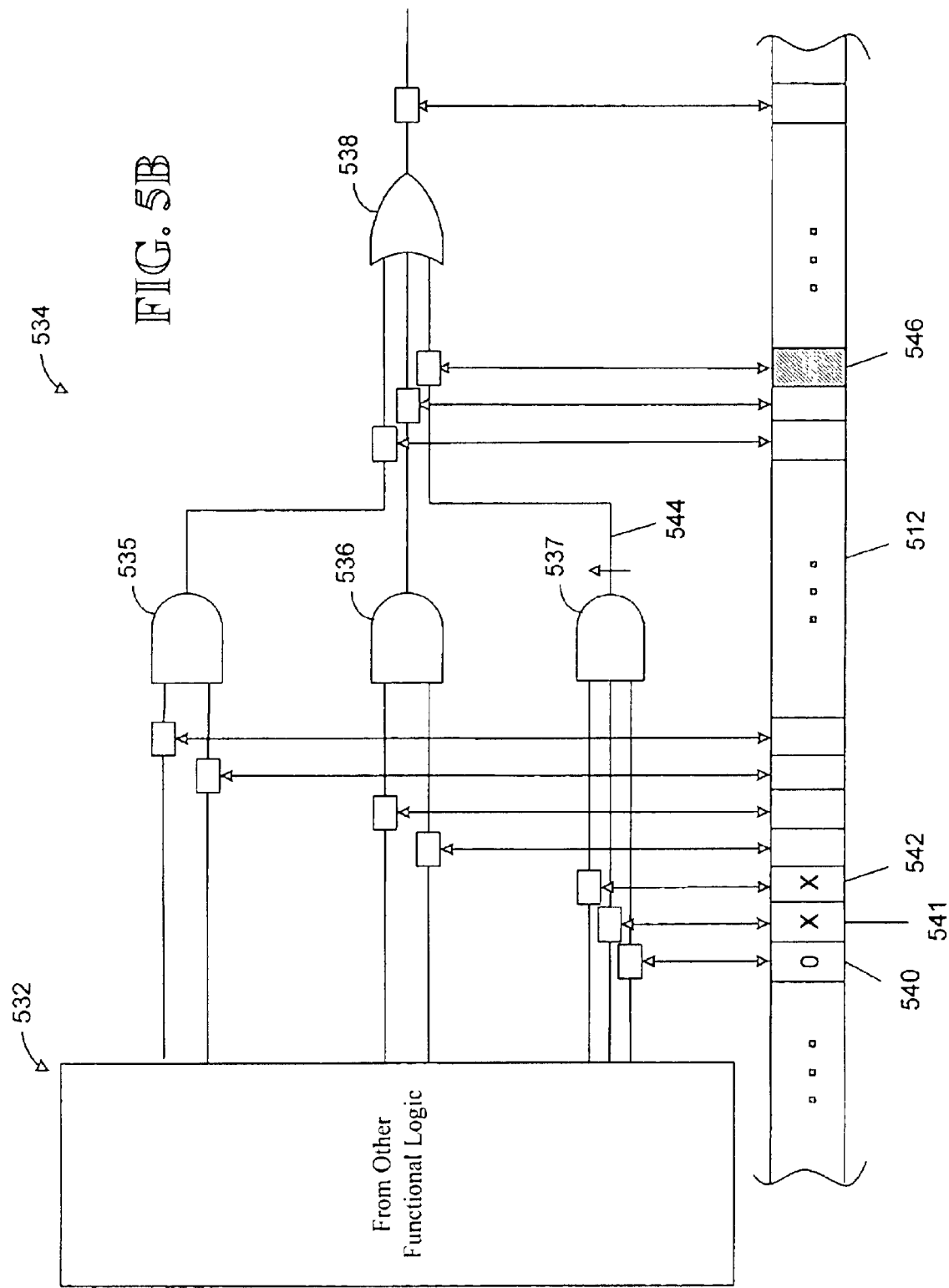

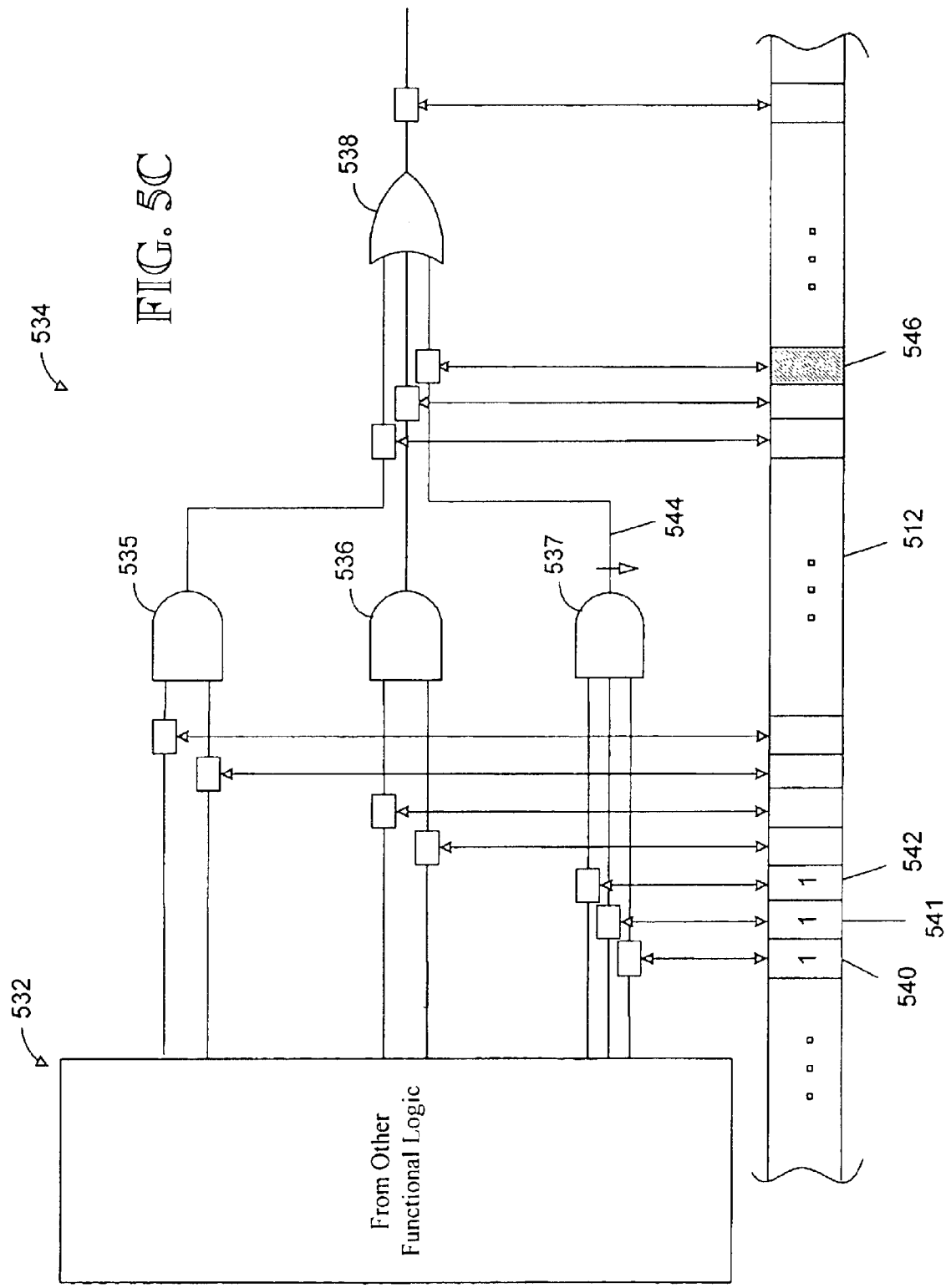

```
X  1  0  1  X  X  X  X  X  1  X  X  X   ← Vector 1
X  X  X  1  0  0  X  X  X  X  X  X  X   ← Vector 2
---------------------------------------
X  1  0  1  0  0  X  X  X  1  X  X  X   ← Compacted Set
```

FIG. 6A

```
X  1  0  1  0  0  X  X  X  X  1  X  X  X   ← Old Compacted Set
X  0  0  X  X  X  1  X  0  1  X  X  X      ← Additional Vector
--------------------------------------------
[X  1  0  1  0  0  X  X  X  X  1  X  X  X]  ← New
[X  0  0  X  X  X  1  X  0  1  X  X  X   ]     Compacted Set
```

FIG. 6B

```
[X  1  0  1  0  0  X  X  X  X  1  X  X  X]  ← Old Compacted Set
[X  0  0  X  X  X  1  X  0  1  X  X  X   ]
 0  1  0  X  X  X  X  X  X  X  X  X  X      ← Additional Vector
--------------------------------------------
[0  1  0  1  0  0  X  X  X  X  1  X  X  X]  ← New
[X  0  0  X  X  X  1  X  0  1  X  X  X   ]     Compacted Set
```

APPARATUS AND METHOD FOR GENERATING A SET OF TEST VECTORS USING NONRANDOM FILLING

BACKGROUND OF THE INVENTION

1. Field of the Invention

The present invention generally relates to testing devices, and more particularly to an improved test pattern generator for generating test vectors in an automatic test pattern generator.

2. Discussion of the Related Art

A variety of automatic test equipment (ATE) has long been known for testing electronic circuits, devices, and other semiconductor and electronic products. Generally, automatic test equipment is divided into two broad categories, analog testers and digital testers. As the names imply, analog testers are generally designed for testing analog circuit devices, while digital testers are designed for testing digital circuit devices. Digital testers, as is known, generally include a testing device having a number of internal circuit cards or channels that, generate programmably controlled test signals for testing and evaluating a Device Under Test (DUT). More specifically, ATE are programmably controlled to be adapted or configured to testing a variety of devices in a variety of ways. This is achieved by programming ATE inputs to inject a certain signal (or signal transition) and by programming ATE outputs to compare a value to a certain pin or signal line on a DUT. In this regard, a digital tester generally includes a test head whereby electrical signals are input to and output from the tester. The test head comprises a number of connectors, each defining a channel, which may be connected via cable or otherwise to a device under test. The electronics within the digital tester may then input and output signals to/from a DUT via the test head.

By way of an extremely simple illustration, consider a digital tester that is configured to test a package containing, among other things, a two input AND gate. The digital tester may be configured to apply a logic one on the two signal lines that correspond to the inputs of the AND gate, then receive the signal on the signal line corresponding to the output to ensure that it is driven to a logic one in response. The tester may then be configured to alternatively apply logic zero signals on each of the two signal lines corresponding to the AND gate inputs, in order to verify that the output of the AND gate transitions from a logic one to a logic zero in response. If proper (i.e., expected) operation is not realized then a defect is detected.

An integrated circuit tester includes a set of modules or "nodes", wherein one node is associated with each terminal of the DUT. When the DUT is an integrated circuit chip (IC) chip, then one node is associated with each pin of the IC chip. A test is organized into a set of successive time segments ("test cycles"). During any given test cycle, each node can either transmit a test signal to the pin, sample a DUT output signal at the associated pin, or do neither. Each node includes its own memory for storing a sequence of these transmit or sample commands ("test vectors").

As is known by those skilled in the art, a test generator is independent and distinct from a tester. A test generator uses a model of a device to formulate a set of test vectors that will efficiently test for and detect faults on the tested device. Whereas, a tester is a device disposed downstream of the test generator. It utilizes the set of test vectors generated by the test generator in order to test the actual device.

A test vector or test pattern, as generated by a test generator, is a string of n logic values (0, 1, or don't care—X) that are applied to the n corresponding primary inputs (PIs) and/or scan input (SI) logic values of a circuit at the same time frame, usually accompanied by m primary outputs (POs) and/or scan output (SO) logic values that represent the expected circuit response. A test sequence is a series of test vectors applied to a circuit (typically a sequential circuit) in a specific order to detect a target fault. The first vector in the test sequence assumes the circuit to be in a completely unknown state. A test set is an unordered set of test vectors (for combinational circuits) or test sequences (for sequential circuits). For combinational circuits with combinational faults, there is no need for test sequences and the test set consists of an unordered set of test vectors. Stated another way, combinational circuits are tested with test sets containing degenerate test sequences that contain only one test pattern each. Test length refers to the number of test vectors in a test set.

In order to reduce the length of a test set, the test set is often compacted. Traditionally, test set compaction was performed statically. Static compaction is the process of reducing the depth of a test set, after all test vectors have been generated. A circuit to be tested may be modeled, and a fault list for that circuit generated. A "fault" is simply a location where a defect might be manifested. Thus, a fault list, is a listing of many (possibly all) locations where faults may occur. A test vector for each fault from the fault list may be generated to test the given fault. In this way, a single test vector is created to test a given circuit fault.

In early systems, a test set of single-fault test vectors was compacted statically. In this regard, a test vector was created for each and every fault on the fault list. After the entire test set was composed, the depth of the test set was reduced by algorithmic operation. Although the specific algorithm may vary from system to system, the general operation was the same. For example, one known algorithm operated by evaluating the first test vector, and determining whether the second test vector could be compacted with it (the first vector). Then the next test vector was analyzed to determine whether it could be compacted with the first vector, and so on down the vectors of the test set, until the end of the set was reached. Then, the process was repeated for the second test vector. Once a subsequent vector was added to (compacted with) a prior test vector, then the latter test vector was deleted from the test set, thereby reducing its depth by one. This process was completed until a fully compacted test set was obtained.

A paper by Prabhakar Goel and Barry C. Rosales (of IBM Corporation), entitled Test Generation & Dynamic Compaction of Tests, and published in the 1979 IEEE Test Conference (hereafter referred to as "the Goel Paper"), described the advantage of dynamic compaction over static compaction, and is hereby incorporated by reference. In short, static compaction is characterized as a "postprocessing" operation, whereby a set of test vectors are first generated. Each test vector in the list is uniquely defined to test for a given fault in a DUT. Once the set of test vectors is generated, it is processed (ergo postprocessing) to reduce the number of vectors in the set through compaction techniques.

In contrast, dynamic compaction operates to generate compacted vectors one at a time. More specifically, a first test vector is generated to test for a given fault in a list of faults to be tested just like the first test vector generated in static compaction). However, before generating a second test vector, an attempt is made to utilize the first test vector to test for additional faults. In this regard, the unspecified bit positions (i.e., don't care values) may be set to either "1"s or "0"s, or existing bit positions may be utilized, to the extent that the values need not be changed. Although the term dynamic compaction may be somewhat misleading, in that the process does not actually "compact" two existing test vectors, the net result is much the same.

A fully compacted test vector is one wherein (i) no PI is at X (don't care), or (ii) no new faults may be detected by making any X value a 0 or a 1. Ideally, dynamic compaction operates to generate a fully compacted test vector before proceeding to the generation of the next test vector. However, in practice, this is usually not the result. Instead, most dynamic compaction algorithms generate what may be termed "substantially compacted" test vectors. As is known, the degree to which a test vector may be compacted will necessarily depend upon the model for the DUT, as well as the particular vectors that are necessary to generate the needed fault tests. Further, after a certain level of compaction has been obtained, further compaction is extremely computationally intensive and thus time consuming. Therefore, once a certain level of compaction has been obtained, the vector is often deemed substantially compacted, and no further compaction is attempted. Instead, the don't care bit positions of the substantially compacted vector are random filled (with 1s and 0s) and fault simulated, and a new test vector is generated.

An advantage of dynamic compaction, as is generally recognized, is that it usually results in a smaller set of test vectors than that achieved by static compaction. Reducing the set of the test vectors, correspondingly reduces time required to generate them. However, dynamic compaction is generally recognized as being computationally intensive. Indeed, since the publication of the Goel Paper, it has been generally accepted in the relevant industry that dynamic compaction achieves better results than static compaction, by reducing the total number of tests that need to be applied at a tester to a given DUT. Nevertheless, as integrated circuits continue to grow in size and complexity, even dynamic compaction techniques result in memory shortages and excessive computation problems, and therefore further improvements are desired.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel, features, the present invention is generally directed to an improved automatic test pattern generator for generating test patterns that are used by an integrated circuit testing device. In accordance with one aspect of the invention, a method is provided for generating a set of test vectors for testing an integrated circuit, each test vector of the set of test vectors containing a plurality of bits defining test inputds for the integrated circuit. The method includes the steps of defining a list of faults for the integrated circuit, and generating at least one test vector that defines values for those inputs necessary to detect at least one target fault selected from the list of faults, the values comprising only a portion of the bits of the at least one test vector, wherein a remainder of the bits in the at least one test vector are unspecified bit positions. The method further includes the step of setting the values of a plurality of the unspecified bit positions using a non-random filling methodology.

In accordance with the invention, the step of setting the values of a plurality of the unspecified bit positions may be carried out in various ways. For example, the step of setting the values of the plurality of the unspecified bit positions may be performed by setting each of the plurality of the unspecified bit positions to a one. Likewise, the step of setting the values of the plurality of the unspecified bit positions may be performed by setting each of the plurality of the unspecified bit positions to a zero. Further, the step of setting the values of the plurality of the unspecified bit positions may be performed by setting each of the plurality of the unspecified bit positions to a repeating or periodic pattern of ones, and zeros. Further still, the step of setting the unspecified bit positions may be performed by setting a plurality of the unspecified bit positions in accordance with a random filling methodology, while another plurality of the unspecified bit positions are set in accordance with a non-random filling methodology, such as one of the methodologies described above. In addition, all unspecified bit positions nay be set to the last specified value in the test vector (i.e., extending the last specified value throughout the unspecified bit positions).

DESCRIPTION OF THE DRAWINGS

The accompanying drawings incorporated in and forming a part of the specification, illustrate several aspects of the present invention, and together with the description serve to explain the principles of the invention. In the drawings:

FIGS. 5A–5C are schematic diagrams illustrating testing procedures for an integrated circuit chip tested in accordance with the present invention;

FIGS. 6A–6D are tables that illustrating a test vector compaction method;

DETAILED DESCRIPTION OF THE PREFERRED EMBODIMENT

Figure 1:
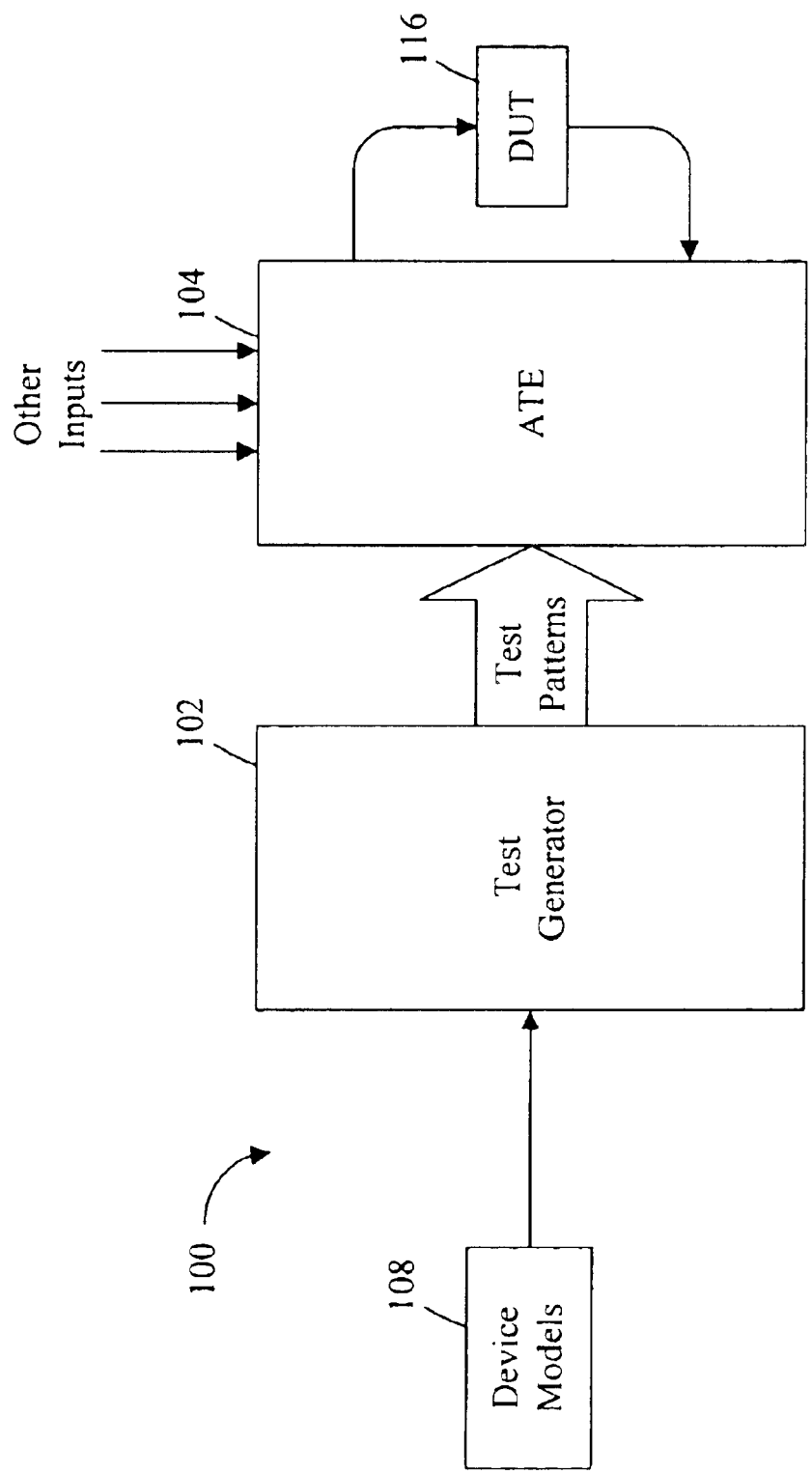
FIG. 1 is a block diagram of an automated testing device for testing digital electronic circuitry.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to FIG. 1, a block diagram of a testing system and process 100 is shown. Although the preferred embodiment of the present invention is directed to an improved test pattern generator 102, FIG. 1 also shows the components of the surrounding environment. The system 100 includes a test generator 102 and an ATE 104. The test generator 102 generates test patterns (in a manner that will be more fully described below) that are communicated to the ATE 104, which may thereafter be used to test a device under test (DUT) 116. In accordance with the preferred embodiment, the DUT 116 is an integrated circuit chip, which is tested by applying input signals to one or more input pins and evaluating output signals delivered to one or more output pins of the DUT 116.

As is known, a comprehensive test plan for the DUT 116 includes a specification of the DUT 116 pins, voltage levels, timing, vectors, and tests. Since the present invention is concerned with the generation of test patterns (vectors), the illustrated embodiment depicts those components relevant to this aspect.

Specifically, a device model 108 contains data for logic and connectivity, and provides the data required for test generator 102 to generate the in-circuit tests. Typically, a device model 108 provides information regarding connectivity and structure of one or more devices. In addition, it specifies implied functions at a low level (such as AND, OR, and NOT, and perhaps other primitives as well).

The test test generator 102 uses the data provided by device model 108 and generates a compacted set of test vectors. Once the compacted set of test vectors is created, it is transferred to the ATE 104, where the compacted set may be used over and over to test DUT's 116.

Figure 2:
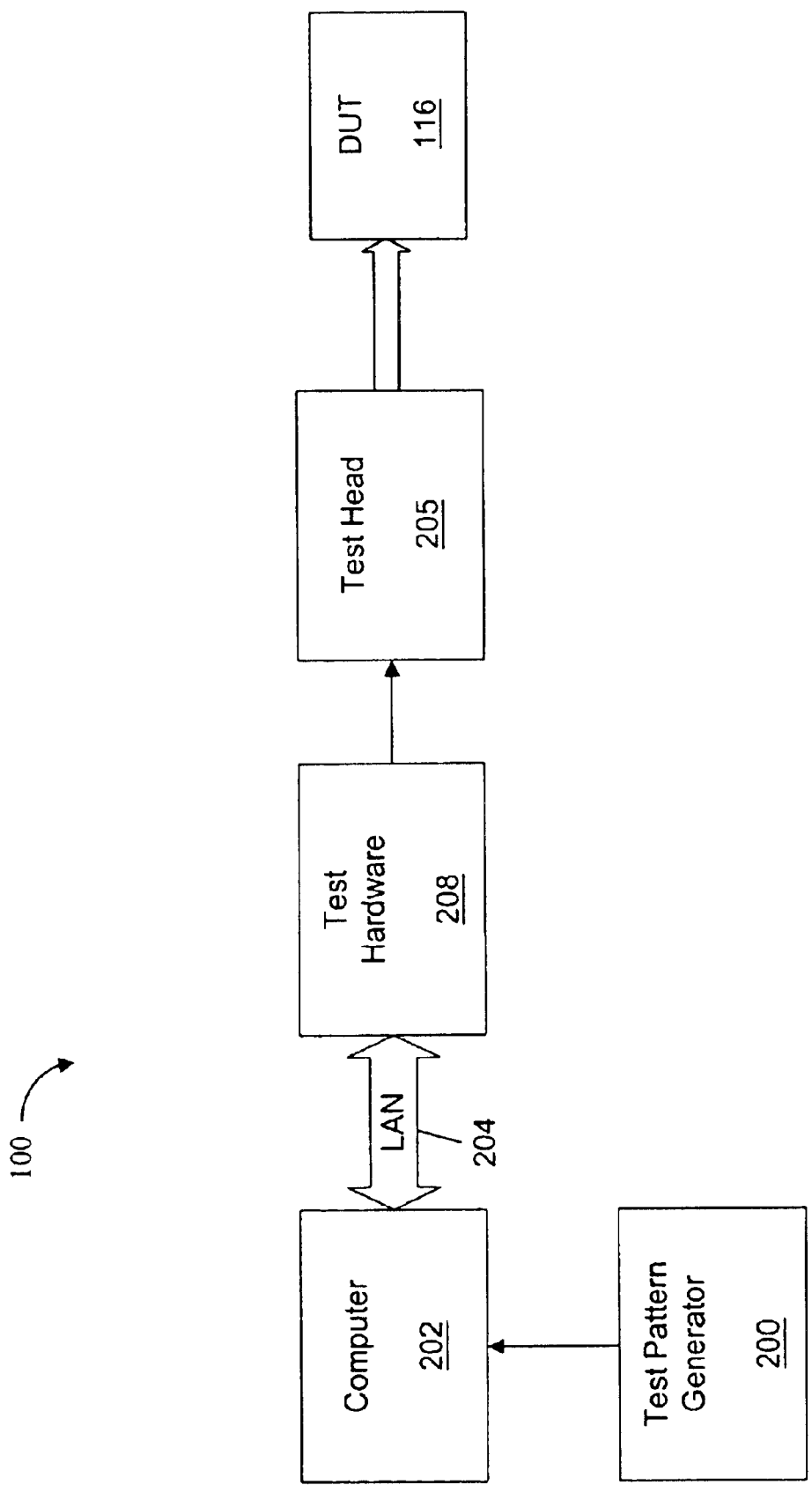
FIG. 2 is a block diagram illustrating an automated testing device.

Reference is now made to FIG. 2, which illustrates an environment in which the tester 100 may operate. A host computer 202 running an application program may be coupled to test hardware 208. In one embodiment, host computer 202 may be coupled to the test hardware 208 via a Local Area Network (LAN) 204. The test hardware 208 typically includes a test head 205 which provides the interface input and output to a DUT 116. The test hardware 208 may include devices, such as drivers and receivers, which can be used to perform testing on the DUT 116. An application program in the host computer 202 may communicate with an interpreter which performs Dynamic Link Library (DLL) calls which instruct remote test head 205 to perform a particular function. The test hardware 208 may receive instructions from the host computer 202. These instructions may then control the various tests that are run on DUT 116.

A test pattern generator 200 constructed in accordance with the present invention, and which will be described in more detail below, provides test pattern data that is input to the computer 202. As will be appreciated, the test pattern generator 200 operates to generate input test patterns before the actual testing execution takes place. Indeed, a compacted set of test patterns may be generated and stored on computer 202 for later test executions.

Figure 3:
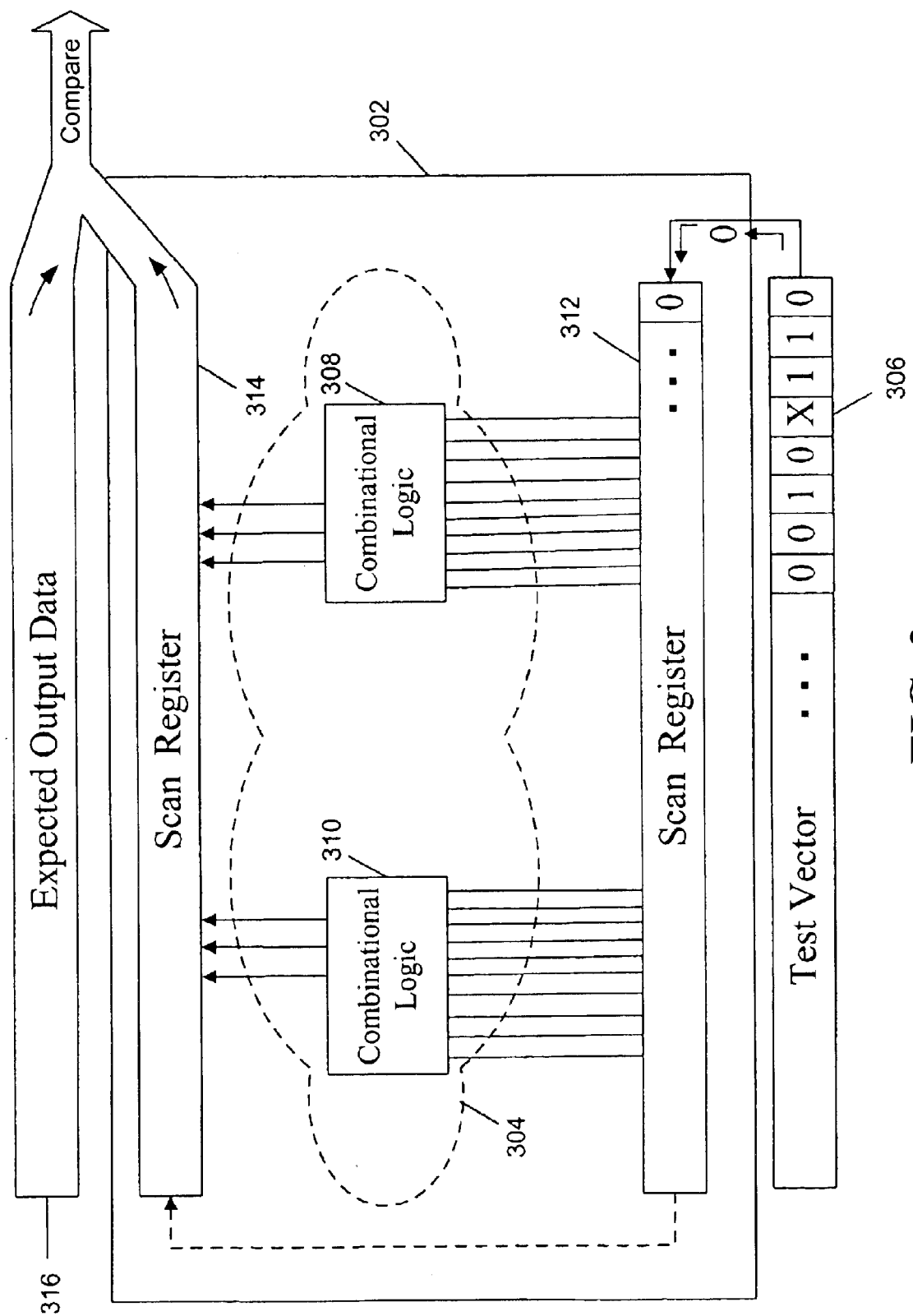
FIG. 3 is a block diagram conceptually illustrating fundamental components of an integrated circuit chip tested in accordance with the present invention.

Referring now to FIG. 3, a block diagram is shown that illustrates a testing environment of the present invention. Specifically, the preferred embodiment of the present invention is directed to a method and apparatus for generating a set of test vectors, and is particularly suited for use in scan-type testing. As is known, broadside testing operates by applying test signals to the input pins of integrated circuit chips, and monitoring the output generated on output pins of that same chip. Due to the density of functional circuitry now provided on integrated circuit chips, scan-type testing is employed. To more specifically describe scan-type testing, if testing hardware has access only to the input and output pins of an integrated circuit chip, then the operation of the vast majority of the circuitry of most integrated circuit chips cannot practically be tested directly. Scan-type testing is achieved by providing specialized circuitry integrated within the integrated circuit chip to be tested that allows test inputs to be propagated into the chip for testing the functional logic thereof, and test outputs to be acquired.

By way of terminology, scan chains or scan registers are utilized in this fashion. For example, and in reference to FIG. 3, an integrated circuit chip 302 includes functional circuitry 304 (which may comprise both sequential and combinational logic) is provided on board the integrated circuit chip 302. A test vector 306 contains a plurality of bits that define the test input and output. As is known, the bits of the test vector 306 are generally set to values of either 1 or 0, but some may be don't care values (e.g., "X"). Often, the test vector 306 is rather lengthy, and may comprise several hundred, or even several thousand, bits. These bit values are then shifted serially into the integrated circuit chip 302 where they may be used to test combinational logic 308 and 310, which may be imbedded deep within the integrated circuit chip 302. In this regard, the bit positions of the test vector 306 are shifted into a scan register 312. The scan register 312 is illustrated in the drawing as a single register. However, and as is known, the register may comprise a plurality of scan chains, which are individual registers or serial bit positions within the chip. Consistent with the terminology used herein, the collection of all the scan chains comprise a scan register. For purposes of simplicity and illustration, only one scan chain has been illustrated in FIG. 3.

In similar fashion, an output scan register 314 may be provided in connection with an output vector register 316. In operation (conceptually), the bits of the test vector 306 are shifted into the scan register 312. The various bit positions of the scan register 312 are input to combinational logic sections 308 and 310 of the integrated circuit 302. Once the entire test vector 306 has been shifted into the scan register 312, the outputs of the combinational logic sections 308 and 310 may be captured by the output scan register 314, then shifted out to an output register 316 where the values are compared against predefined expected data values. This concept is illustrated graphically by the "Compare" arrow.

It should be appreciated that the input scan register 312 and output scan register 314 have been illustrated as such merely to simplify the discussion herein. In practice, each bit position of a scan chain may be both an input and an output. That is, a test vector may be clocked into the chip via an input scan chain. Then, once the entire test vector is clocked into the chip, the functional circuitry to be tested is tested (by the vector), and the scan register may again be clocked to capture output values. At this time, the same scan chain/register may be viewed as an output scan register 314, and its value may be clocked out of the chip, where it is compared against an expected value for that register. Dashed lines coupling the two illustrated registers 312 and 314 depict this concept of register continuity and bi-directionality.

Figure 4:
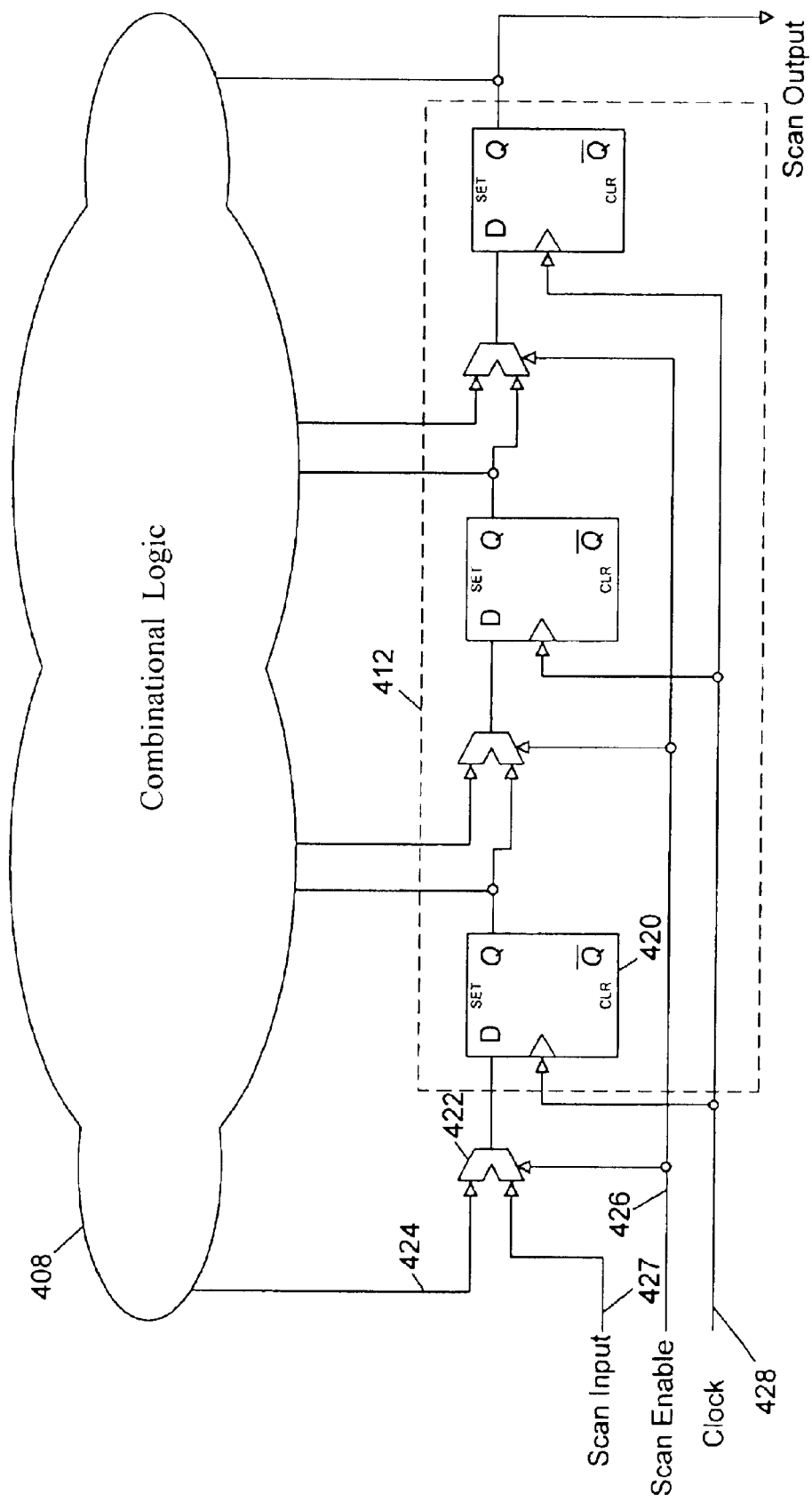
FIG. 4 is a schematic diagram illustrating components of an integrated circuit chip tested in accordance with the present invention.

It will be appreciated that the diagram of FIG. 3 has been presented purely for purposes of illustration and, in light of the discussion that follows in connection with FIGS. 4 and 5, a better understanding of the preferred embodiments will be appreciated. What should be appreciated from FIG. 3, however, is that by utilizing scan chains (or a scan register) bits of a test vector may be propagated into and out of an integrated circuit chip 302 to allow direct testing of functional logic that may be buried deep within the integrated circuit chip 302, and thus not directly accessible or testable by the pins of the integrated circuit chip 302.

Reference is now made to FIG. 4, which illustrates a more practical implementation of the scan chains and scan register of the preferred embodiment. In this regard, instead of providing a separate register to comprise the scan register 312, typically sequential logic already embedded within the circuit chip is utilized. For example, and again for purposes of illustration, assume flip flops (e.g., 420) are provided in an integrated circuit chip, and are functionally configured to operate in a certain manner. Test vector values may be shifted into these registers via, for example, multiplexers 422. In this regard, a multiplexer 422 may have 2 inputs: one for receiving an input from the functional logic 424 provided on the chip, and one for receiving input values from a scan input 427 provided in connection with the testing configuration of the chip. A scan enable line 426 may be provided as a multiplexer select, to select which of the two inputs is routed through the multiplexer 422 to the flip flop 420. Once the various bit values of the test vector 306 have been shifted into the scan chain 412, the scan enable line 426 may be set to propagate the appropriate bit values of the scan chain 412 to the various sequential circuit devices (e.g., 420). As will be understood, a clock line (denoted as scan clock) 428 may be toggled to clock in the various bit values through the respective sequential circuit components comprising the scan chain (or scan register) 412. In this way, the various outputs of the sequential circuit components may be controllably set in order to test the combinational logic 408 of the integrated circuit chip. In this regard, it is assumed that the functional logic of an integrated circuit chip will comprise a combination of sequential and combinational logic, which may be organized in various layers (e.g, a layer of sequential logic, then a layer of combinational logic, then a layer of sequential logic, another layer of combinational logic, etc.). Any given "layer" of combinational logic may be tested by controlling the values directed to the inputs of that combinational logic, in a manner described above and illustrated in connection with FIG. 4, and observing its outputs. The outputs of the combinational logic components may then be directed to one or more output scan chains, which then may be shifted serially out of the integrated circuit chip for evaluation by the testing equipment. In this regard, and as illustrated in FIG. 3, a separate output scan register may be formed within the chip, or alternatively, the output scan chain utilize the same sequential registers as the input scan chain.

By way of clarification, and as will be understood, the broad concepts and teachings of the present invention applies to sequential circuitry as well as combination logic. Specifically, the generation of a set of test vectors applies to both types of circuitry. One embodiment of the invention, as described herein is directed to the generation of a set of test vectors for testing combinational logic. However, the method of the invention, may also be used to generate test vectors for sequential circuit testing as well. To simplify the inventive concepts, however, the invention has been illustrated only with respect to the test pattern generation of combinational logic.

In short, one embodiment (combinational automated test pattern generation) generates a list of test vectors one by one, and simultaneously compacts that list (one by one). In an alternative embodiment for test pattern generation sequential logic, a sequence of test vectors would be generated in place of each test vector of the previous embodiment. Thus, the invention would operate on a set of test vector sequences, which may be different lengths. The length of a given sequence would depend upon the number of sequential logic layers traversed by the test generator.

The concepts of the present invention may also apply to analog circuitry, in certain situations. For example, when the analog circuitry is configured in a logic-like fashion (e.g., comparators).

Returning now to the drawings, reference is made to FIGS. 5A through 5C to further illustrate the concept of testing and test vectors in a target environment of the preferred embodiment of the present invention. In this regard, FIG. 5A illustrates a layer segment of combinational logic 534, with other functional (sequential and combinational) logic 532. In the illustrated embodiment the segment of combinational logic 534 includes AND gates 535, 536 and 537, and an OR gate 538. A scan chain or scan register 512 is also illustrated as having bit values that are directly connected to signal lines of the various combinational logic circuit components. Although, as described in FIG. 4, the scan chain is preferably formed from sequential circuitry (such as D flip-flops), but has been illustrated in FIG. 5A in a different manner simply to facilitate the discussion herein. In the particular illustration of FIG. 5A, each input line and output line of the various combinational logic components is associated with a bit position (e.g., one flip-flop) in the scan chain 512.

Now referring to FIG. 5B, if the output of the AND gate 537 were to be tested for a "stuck at" "1" fault, at least one of the input lines must be set to "0". The two remaining input lines could be set to don't care values (e.g., "X"). In this regard, the three bits 540, 541, and 542 may comprise the values "OXX" "XOX", or "XXO", as any of these three values would properly test the stuck at "1" fault condition on line 544. An output bit position 546 is associated with the signal line 544 in order to read and test the value output from AND gate 537. Thus, with the input of "OXX" as illustrated in FIG. 5B, the output of bit position 546 should be a 0, if the AND gate 537 is working properly. If, however, there is a stuck at "1" fault at the output of AND gate 537, the bit position of 546 would be a 1.

Reference is now made to FIG. 5C. In similar fashion, a stuck at "0" fault at the output of AND gate 537 may be tested by setting bit positions 540, 541, and 542 all to "1". The output bit position 546 may then be monitored to determine whether it is a "1" or "0" (in response to the "111" inputs) A "1" in the bit position 546 indicates proper operation of the AND gate 537. However, a "0" indicates a stuck at "0" fault on line 544.

In view of the foregoing discussion, it will be appreciated that similar faults may be tested for AND gates 535 and 536. Furthermore, it is readily verified that each of the fault conditions specified for the AND gates 535, 536, and 537 are mutually exclusive. That is, there is no overlap in either the input bits or the output bits of scan chain 512 for testing stuck at one faults for any of the three AND gates, or for testing stuck at zero faults for any of the AND gates. Thus, three separate test vectors that are generated, for example, for testing the three individual AND 535, 536, and 537 may be compacted into a single test vector. Advantageously, the result of such compaction reduces the memory requirement of the tester, and also speeds the testing process by allowing a single test vector to be shifted into the scan chain 512, as opposed to having to shift three separate test vectors into that scan chain; a process which obviously takes significantly more time to perform.

Having illustrated the principal concepts regarding testing using scan-type testing, reference is now made to FIGS. 6A through 6D, which illustrate the test set generation. Unlike prior art systems, and those prevalent in the marketplace today, which utilize so-called dynamic compaction methods, one embodiment of the invention utilizes a true dynamic compaction method. In this regard, test generators that are considered to perform dynamic compaction typically operate by defining a test vector that will test for a given fault. Then that test vector is expanded (by defining more bit positions) to test for an additional given fault. Then that expanded test vector is expanded again and again in this manner, until a fully utilized test vector is obtained. This process is referred to herein as "so-called" dynamic compaction, in that it is not really compacting two distinct vectors, but rather is operating to expand a given vector to detect additional fault(s). In contrast, a "true" dynamic compaction algorithm, operates to compact two distinct vectors into a single vector.

Although most test vectors will comprise hundreds, if not thousands, of bit positions, for simplification, a test vector of 14 bits is illustrated in FIGS. 6A through 6D. Assume, for purposes of illustration, a first vector is generated having the value "X101XXXXXX1XXX" (again, where "X" denotes a don't care bit position) and a second vector is generated having the value "XXX100XYXXXXXX". It is readily verified that these two vectors are readily compactable to produce a compacted test vector of "X10100XXXX1XXX". Now referring to 6B, assuming the compacted set of FIG. 6A now comprises a first vector, and assuming a second test vector of "XX00XXX1X01XXXX", it is readily verified that those two vectors are not compactable. Accordingly, the compacted test set will comprise the two vectors.

Figure 6D:
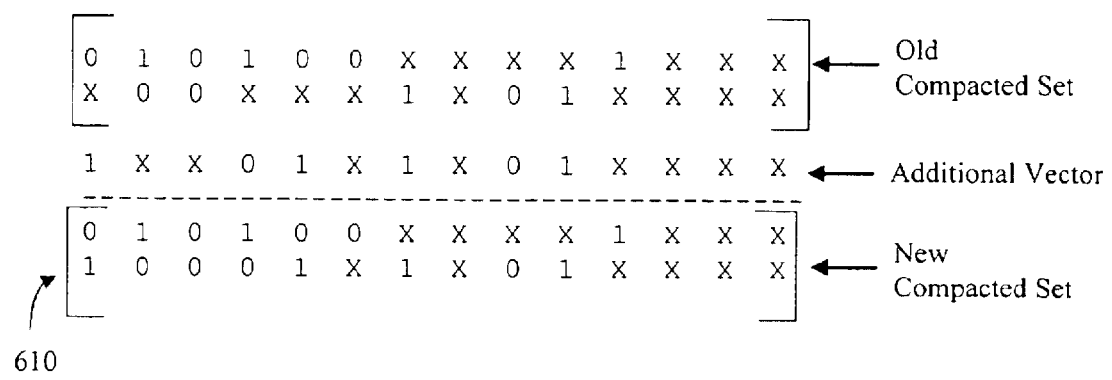

Referring now to FIG. 6C, and assuming as a starting point the compacted test set of FIG. 6B, an additional vector having a value "010XXXXXXXXXXX" is generated, it is seen that this additional vector may be compacted with the first vector of the old compacted set, thereby generating a new compacted set, as designated by reference numeral 610. Again, using this compacted set of two vectors as a starting point and generating an additional test vector of "1XX01X1X01XXXX" (FIG. 6D), the additional vector may not be compacted with the first vector of the compacted set, but is compactable with the second vector of the vector set, thereby generating a compacted set of test vectors 610. This process of generating additional test vectors and evaluating the existing set of compacted test vectors one by one to determine whether the additionally generated vectors may be compacted into any of the existing vectors may be repeated until all test vectors (corresponding to a list of faults to be tested) have been generated and compacted. The resulting set of test vectors provides a highly compact and efficient set of test vectors for testing a device.

Figure 7:
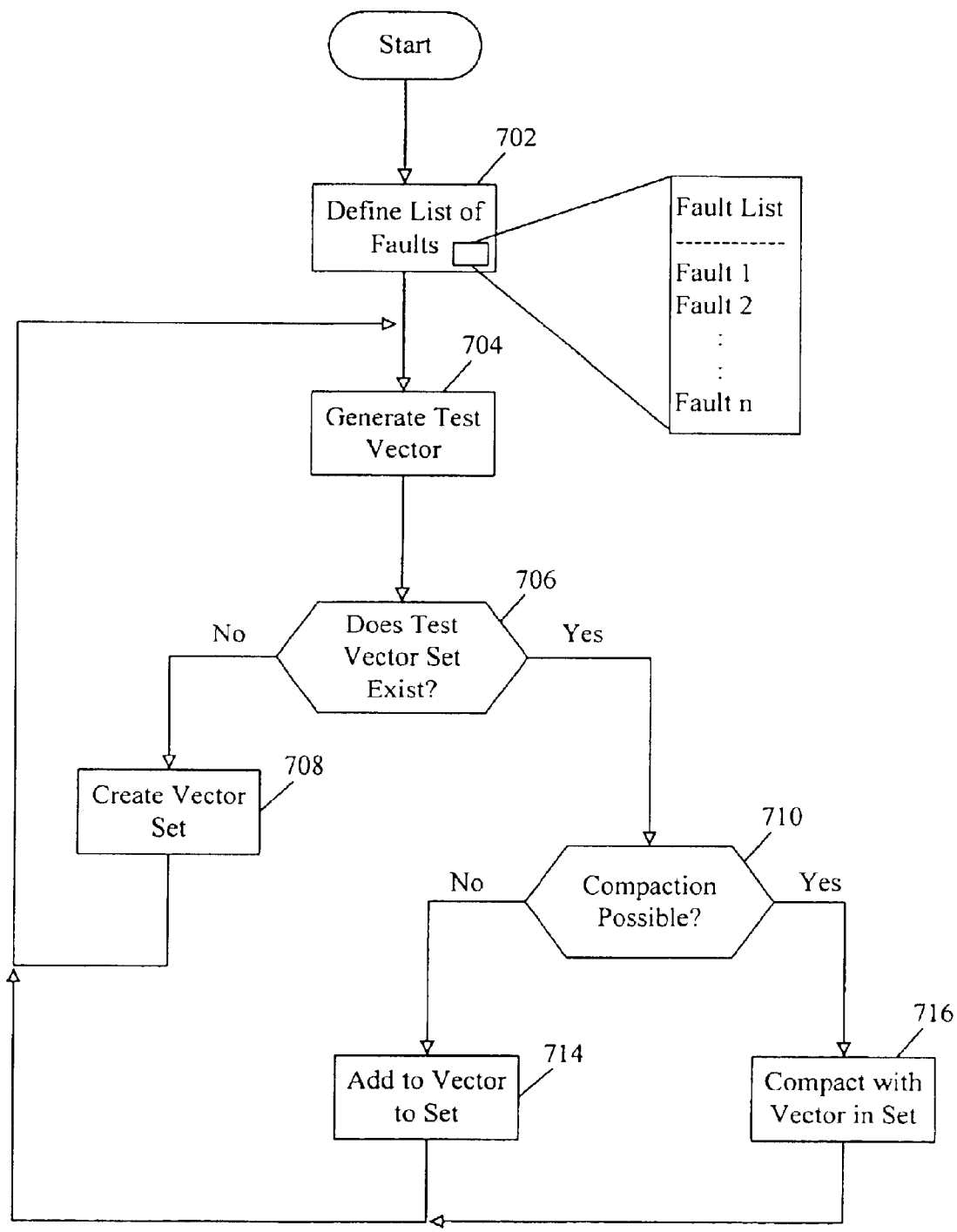
FIG. 7 is a flowchart illustrating the fundamental functional operation of a compaction method.

Reference is now made to FIG. 7 which illustrates the fundamental steps involved in the method of one embodiment of the present invention. This embodiment first operates by defining a list of faults of an integrated circuit chip that are to be tested (step 702). This step need not be further discussed herein, as it will be appreciated that a given fault will be defined by the logic and chip layout of the particular integrated circuit to be tested. For each fault in the list of faults, a test vector is generated. Specifically, in this embodiment test vectors are generated one at a time for each fault in the list of faults (step 704). Consistent with the scope and concepts of the invention, however, an alternative embodiment may generate a test vector that detects more than one fault in the list of faults.

At step 706, the embodiment evaluates the test vector to determine whether a test vector set presently exists. If not, the embodiment will create a set which will be defined simply as the test vector previously generated (step 708). If a test vector set presently exists, the embodiment will then compare the newly generated test vector with each vector presently in the set to determine whether the newly generated test vector may be compacted with any vector in the test set (step 710). If not, the newly generated vector is added to the set of test vectors (step 714) and the system returns to step 704 where it generates the next test vector (corresponding to the next fault in the fault list). If compaction, however, is possible, then the newly-generated test vector is compacted with an existing vector of the test set at (step 716) and the system returns to step 704 where the next test vector is generated.

The process illustrated in FIG. 7 is repeated until a test vector is generated that corresponds to each fault in the list of faults. Accordingly, what is produced is a compacted set of test vectors that test every fault in a list of faults, in an efficient fashion.

In addition to the primary steps illustrated in FIG. 7, and in accordance with one embodiment of the invention, it may be desired to periodically perform a fault simulation with a less-than-complete set of test vectors. If, for example, it is found that a given test vector not only adequately tests a defined fault, (i.e., the fault the test vector was configured to test) but also test one or more additional faults, then the list of faults may be reduced and therefore the number of test vectors generated may be correspondingly reduced. This may generate a compacted set of test vectors that is even more compact than that which would otherwise be generated by this embodiment of the invention. In accordance with yet another embodiment of the present invention, once a compacted set of test vectors is generated, the invention may operate upon that compacted set by random filling each don't care bit value with a "1" or "0".

Specifically, arbitrary filling may be utilized to eliminate redundant vectors in the set. For example, don't care values of the first vector in the set may be random filled. This vector may then be again evaluated to determine whether it detects any additional faults, as a result of the random filled values. If so, the remaining vectors in the set may be evaluated. If any vector(s) remaining in the set test only for that additional fault(s) detected by the random filling, then that remaining vector(s) is redundant and may be removed from the set. Alternatively, all vectors may be arbitrarily filled (with 1s and 0s), then evaluated (as a group) to eliminate redundant vectors.

Figure 8A:
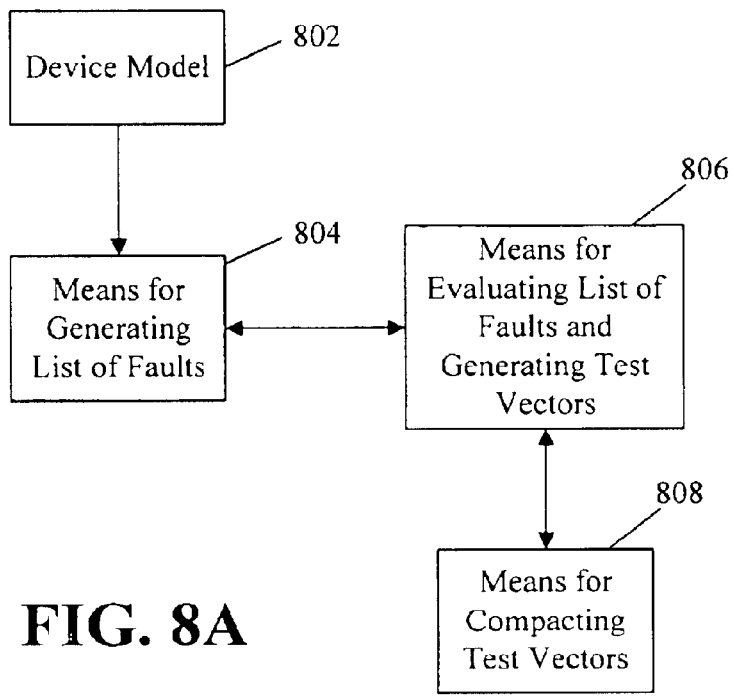
FIGS. 8A and 8B are block diagrams illustrating fundamental component of an apparatus for compacting a set of test vectors.
Figure 8B:
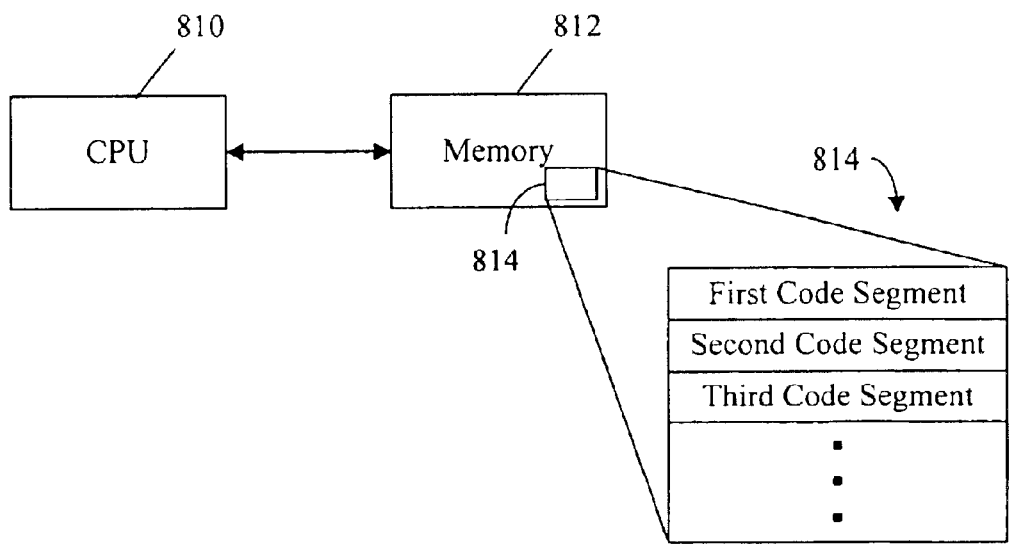

Reference is now made to FIGS. 8A and 8B, which illustrate a top-level diagram of an apparatus constructed in accordance with the above-described embodiment of the invention. In this regard, a device model 802 is a computer model that, as the name implies, models the operation of a device to be tested. A means for generating a list of faults 804, is provided in connection with the device model 802. This means may be implemented through software to evaluate the device model 802 and generate a list of faults to be tested. In communication with the means 804, means 806 is provided for evaluating the list of faults and generating test vectors for testing each fault in the list of faults. Finally, a means 808 is provided for compacting the list of test vectors generated by the means 806.

Referring to FIG. 8B, the apparatus of FIG. 8A may be embodied in software. In this regard, a CPU 810 operates in conjunction with memory 812. A portion of memory 814 may comprise a plurality of code segments for implementing each of the components of FIG. 8A. For example, a first code segment may be provided for defining a list of faults of combinational logic in an integrated circuit chip. A second code segment may be provided for generating an uncompacted set of test vector, which may comprise one or more test vectors for testing faults in the list of faults. A third code segment may be provided for evaluating newly generated test vectors and compacting those newly generated vectors (on an individual basis) with test vectors presently existing in the set.

Having described certain environments and embodiments of the present invention above, reference will now be made to a preferred embodiment of the invention. In this regard, a preferred embodiment of the present invention is directed to a system and method of performing non-random vector filling during test generation.

As described above, "arbitrary" filling may be utilized to eliminate redundant vectors in a test set. The term "arbitrary" was specifically chosen to cover both random and non-random filling methodologies. As used above, "arbitrary" filling referred to the filling performed after compacting a test sequence. However, the present invention is independent of the compaction algorithm, and even compaction itself. Therefore, the filling performed by the present invention may be performed before, during, after (and indeed without) compaction. The preferred embodiment of the present invention is particularly directed to a non-random filling methodology.

To more particularly describe, it is generally known to those skilled in the art that algorithms and methodologies used for generating test vectors typically set only a relatively small percentage of the bits of a test vector. The remaining, unset bits may then be left as don't care values, or may alternatively be set. If set, they are filled either randomly or non-randomly. Empirical data suggests that there is a benefit to filling the unspecified bits of a test vector. This benefit is realized by a greater coverage in faults (i.e., tests for more faults than if unspecified bits are left unset).

With regard to filling, it is possible to detect faults in a circuit by merely setting the inputs of a vector to arbitrary values. For a typical vector, there is a strong correlation between the number of faults detected by the vector and the number of inputs set in a vector, regardless of the values of the inputs. Thus, "filling" a vector set may detect additional faults, or may cause some of the vectors to become redundant and allow them to be eliminated via fault simulation. Random filling is the most popular method, as it tends to detect the most additional faults and eliminate the most vectors via redundancy.

As between random versus non-random filling, it is believed that random filling may realize a slightly greater fault coverage. However, non-random filling can realize other benefits. For example, test sets generated by using non-randon fill methodologies may be much more effectively compressed, thereby requiring less memory for storage. It will be appreciated that non-random filling may be implemented in any of several ways. For example, all unspecified bit positions may be set to a value of one. Likewise, all unspecified bit positions may be set to a value of zero. In addition, all unspecified bit positions may be set to the last specified value in the test vector (i.e., extending the last specified value throughout the unspecified bit positions). For example, the vector "OXXIXOXXXOX-IXXX" would become "000110000001111" using such an "extended" filling methodology.

Further still, all unspecified bit positions may be set in accordance with some periodic or repeating sequence. Other patterns or methodologies of non-random filling, particularly methodologies conducive to compression, may be implemented in accordance with the scope and spirit of the present invention.

Furthermore, it should be appreciated that, in accordance with the invention, a portion of the unspecified bit positions may be random filled, while the remaining portion may be filled in accordance with one or more of the non-random fill methodologies discussed above.

The foregoing description has been presented for purposes of illustration and description. It is not intended to be exhaustive or to limit the invention to the precise forms disclosed. Obvious modifications or variations are possible in light of the above teachings. The embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for testing an integrated circuit, the method comprising:

defining a list of faults for which an integrated circuit is tested;

generating a test vector comprising a plurality of bits defining test inputs to the integrated circuit;

assigning values to a portion of the plurality of bits of the test vector to detect at least one unmarked target fault selected from the list of faults, whereby a remainder of the bits of the test vector are left as unspecified bits;

marking said at least one unmarked target fault as detected;

repeating the generating, assigning, and marking until all target faults of the list of faults are marked;

non-randomly filling a plurality of the unspecified bits for each test vector with values that enable each test vector to be compressed; and compressing each test vector to create a compressed vector having fewer bits.

2. The method of claim 1, wherein the unspecified bits are non-randomly filled after all target faults are marked.

3. The method of claim 1, wherein non-randomly filling the plurality of the unspecified bits further comprises filling each of the plurality of the unspecified bits to a value of zero.

4. The method of claim 1, wherein non-randomly filling the plurality of the unspecified bits further comprises filling each of the plurality of the unspecified bits to a value of one.

5. The method of claim 1, wherein non-randomly filling the plurality of the unspecified bits further comprises filling subsequent unspecified bits with the value of a latest specified bit.

6. The method of claim 1, wherein non-randomly filling the plurality of the unspecified bits further comprises filling each of the plurality of the unspecified bits with a repeating pattern of ones and zeros.

7. The method of claim 1, further comprising randomly filling a second plurality of unspecified bits for each test vector.

8. The method of claim 1, wherein said repeating the generating further comprises:

determining whether a currently generated test vector may be compacted with a previously generated test vector, and if so, compacting the currently generated test vector with the previously generated test vector, and if not, adding the currently generated test vector to a set of test vectors.

9. The method of claim 8, wherein said determining is performed before said non-randomly filling.

10. The method of claim 8, wherein said determining is performed during said non-randomly filling.

11. The method of claim 8, wherein said determining is performed after said non-randomly filling.

12. The method of claim 1, wherein the assigning further comprises assigning values to only those bits of the test vector for detecting a single unmarked target fault selected from the list of faults.

13. The method of claim 1, further comprising:

fault simulating a generated test vector to determine if the test vector detects additional faults, and if so, marking said additional faults as detected.

14. An apparatus for generating a set of test vectors, the apparatus comprising:

means for evaluating a list of faults for which an integrated circuit is tested;

means for generating a first test vector comprising a plurality of bits defining test inputs to the integrated circuit;

means for assigning values to a fraction of the plurality of bits of the first test vector to detect at least one target fault selected from the list of faults, whereby a remainder of the bits of the first test vector are left as unspecified bits;

means for marking the at least one target fault as detected;

wherein the means for generating further generates another test vector comprising a plurality of bits defining test inputs to the integrated circuit;

wherein the means for assigning further assigns values to a fraction of the plurality of bits of said another test vector until all target faults are detected, the values being assigned to detect at least one unmarked target fault selected from the list of faults, whereby a remainder of the bits of said another test vector are left as unspecified bits;

wherein the means for marking further marks said at least one unmarked target fault as detected until all target faults of the list of faults are marked;

means for non-randomly filling a plurality of the unspecified bits for each test vector with values that enable each test vector to be compressed; and means for compressing each test vector to create a compressed vector having fewer bits.

15. The apparatus of claim 14, wherein the means for non-randomly filling fills the plurality of unspecified bits after all target faults are marked.

16. The apparatus of claim 14, wherein the means for non-randomly filling the plurality of the unspecified bits further comprises means for filling each of the plurality of the unspecified bits to a value of zero.

17. The apparatus of claim 14, wherein the means for non-randomly filling the plurality of the unspecified bits further comprises means for filling each of the plurality of the unspecified bits to a value of one.

18. The apparatus of claim 14, wherein the means for non-randomly filling the plurality of the unspecified bits further comprises means for filling subsequent unspecified bits with the value of a latest specified bit.

19. An automatic test pattern generator (ATPG) for testing an integrated circuit for a list of faults, the ATPG comprising:

logic for generating a set of test vectors, each test vector of the set of test vectors containing a plurality of bits defining test inputs to the integrated circuit;

logic for assigning values to a number of bits for each test vector such that each test vector is capable of detecting at least one target fault selected from the list of faults, whereby a remainder of the bits of each test vector are left as unspecified bit positions, the logic for assigning continuing to assign values to the bits of the test vectors until all target faults in the list of faults are detected; and logic for non-randomly filling a plurality of the unspecified bit positions for each test vector after the logic for assigning has assigned values to detect all target faults, the logic for non-randomly filling thereby enabling each test vector to be compressed; and logic for compressing each test vector to create a compressed vector having fewer bits.

20. The ATPG of claim 19, wherein the logic for non-randomly filling the plurality of unspecified bit positions is further configured to randomly fill a second plurality of unspecified bit positions for each test vector.

21. The ATPG of claim 19, further comprising:

logic for compacting the set of test vectors to the fullest possible extent.

22. The ATPG of claim 21, wherein the logic for compacting performs compaction before the logic for non-randomly filling performs filling the unspecified bit positions.

* * * * *